United States Patent
Chang et al.

(10) Patent No.: US 9,935,103 B2
(45) Date of Patent: *Apr. 3, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/392,693

(22) Filed: Dec. 28, 2016

(65) Prior Publication Data
US 2017/0110454 A1   Apr. 20, 2017

Related U.S. Application Data

(63) Continuation of application No. 15/086,433, filed on Mar. 31, 2016, now Pat. No. 9,559,100, which is a
(Continued)

(51) Int. Cl.
*H01L 21/70*   (2006.01)
*H01L 27/088*  (2006.01)
(Continued)

(52) U.S. Cl.
CPC .... *H01L 27/0886* (2013.01); *H01L 21/02164* (2013.01); *H01L 21/31055* (2013.01);
(Continued)

(58) Field of Classification Search
CPC ............. H01L 27/0886; H01L 27/0924; H01L 21/02164; H01L 21/31055;
(Continued)

(56) References Cited

U.S. PATENT DOCUMENTS 7,385,247 B2   6/2008   Rhee et al.
7,867,853 B2   1/2011   Mine
(Continued)

FOREIGN PATENT DOCUMENTS

JP      2009-158813 A    7/2009
KR   10-2013-0040110 A    4/2013
(Continued)

OTHER PUBLICATIONS

Notice of Allowance U.S. Appl. No. 14/611,159 dated Dec. 23, 2015.
(Continued)

*Primary Examiner* — Tu-Tu Ho
(74) *Attorney, Agent, or Firm* — McDermott Will & Emery LLP

(57) ABSTRACT

A semiconductor device includes first and second Fin FET and a separation plug made of an insulating material and disposed between the first and second Fin FETs. The first Fin FET includes a first fin structure extending in a first direction, a first gate dielectric formed over the first fin structure and a first gate electrode formed over the first gate dielectric and extending a second direction perpendicular to the first direction. The second Fin FET includes a second fin structure, a second gate dielectric formed over the second fin structure and a second gate electrode formed over the first gate dielectric and extending the second direction. In a cross section a maximum width of the separation plug is located at a height $H_b$, which is less than ¾ of a height $H_a$ of the separation plug.

20 Claims, 11 Drawing Sheets

Related U.S. Application Data continuation of application No. 14/611,159, filed on Jan. 30, 2015, now Pat. No. 9,331,074.

(51) Int. Cl.

| | |
|---|---|
| *H01L 29/423* | (2006.01) |
| *H01L 29/66* | (2006.01) |
| *H01L 21/8234* | (2006.01) |
| *H01L 21/3105* | (2006.01) |
| *H01L 21/02* | (2006.01) |
| *H01L 21/3213* | (2006.01) |
| *H01L 29/06* | (2006.01) |
| *H01L 29/49* | (2006.01) |
| *H01L 29/51* | (2006.01) |
| *H01L 21/8238* | (2006.01) |
| *H01L 27/092* | (2006.01) |

(52) U.S. Cl.
CPC .......... *H01L 21/32139* (2013.01); *H01L 21/823431* (2013.01); *H01L 21/823468* (2013.01); *H01L 21/823481* (2013.01); *H01L 21/823821* (2013.01); *H01L 21/823864* (2013.01); *H01L 21/823878* (2013.01); *H01L 27/0924* (2013.01); *H01L 29/0649* (2013.01); *H01L 29/42376* (2013.01); *H01L 29/495* (2013.01); *H01L 29/4966* (2013.01); *H01L 29/517* (2013.01); *H01L 29/6681* (2013.01); *H01L 29/66545* (2013.01); *H01L 21/32137* (2013.01); *H01L 21/823437* (2013.01)

(58) Field of Classification Search
CPC ....... H01L 21/32139; H01L 21/823431; H01L 21/823437; H01L 21/823481; H01L 29/0649; H01L 29/495; H01L 29/66545
USPC ........................................................ 257/369
See application file for complete search history.

(56) References Cited

U.S. PATENT DOCUMENTS

| | | | |
|---|---|---|---|
| 8,723,236 B2 | 5/2014 | Liu et al. | |
| 8,901,665 B2 | 12/2014 | Kelly et al. | |
| 8,987,827 B2 | 3/2015 | Montanini et al. | |
| 9,129,837 B2 | 9/2015 | Takaishi | |
| 9,331,074 B1 * | 5/2016 | Chang | H01L 27/0886 |
| 2013/0161762 A1 | 6/2013 | Kelly et al. | |
| 2016/0336320 A1 * | 11/2016 | Lin | H01L 27/0924 |

FOREIGN PATENT DOCUMENTS

| | | |
|---|---|---|
| KR | 10-2013-0079099 A | 7/2013 |
| WO | 2013101007 A1 | 7/2013 |

OTHER PUBLICATIONS

Notice of Allowance U.S. Appl. No. 15/086,433 dated Sep. 26, 2016.

Notice of Allowance Korean Patent Application No. 10-2015-0061146 dated Nov. 21, 2016 with English translation.

* cited by examiner

SEMICONDUCTOR DEVICE AND MANUFACTURING METHOD THEREOF

RELATED APPLICATIONS

This application is a Continuation Application of U.S. patent application Ser. No. 15/086,433, filed on Mar. 31, 2016, now U.S. Pat. No. 9,559,100, which is a Continuation of U.S. patent application Ser. No. 14/611,159 filed on Jan. 30, 2015, now U.S. Pat. No. 9,331,074, the disclosure of each Application is incorporated herein by reference in entirety.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
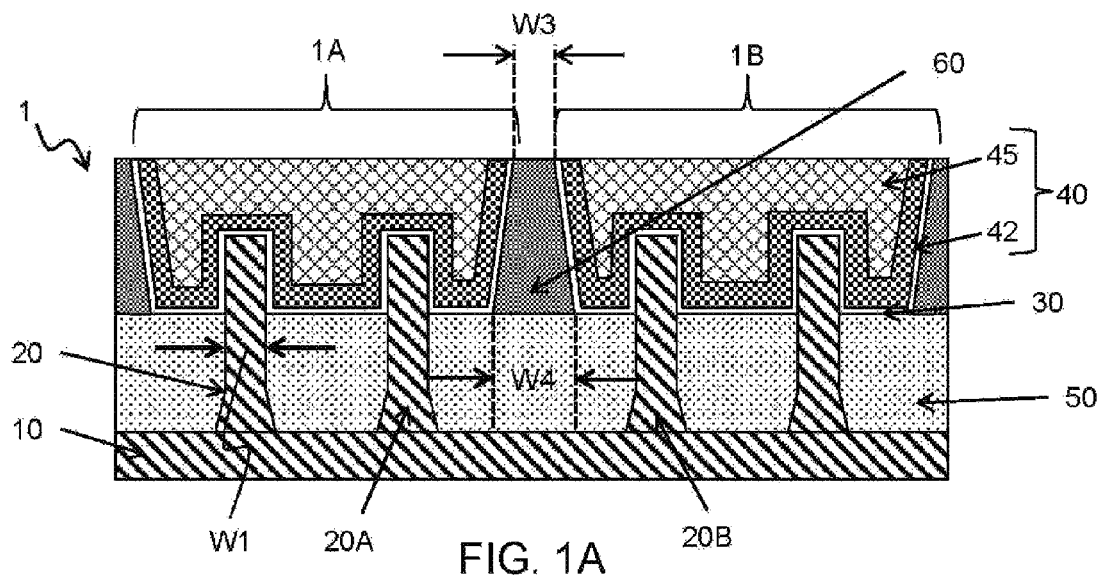
FIG. 1A is an exemplary cross sectional view of a semiconductor FET device having a fin structure (Fin FET)
Figure 1B:
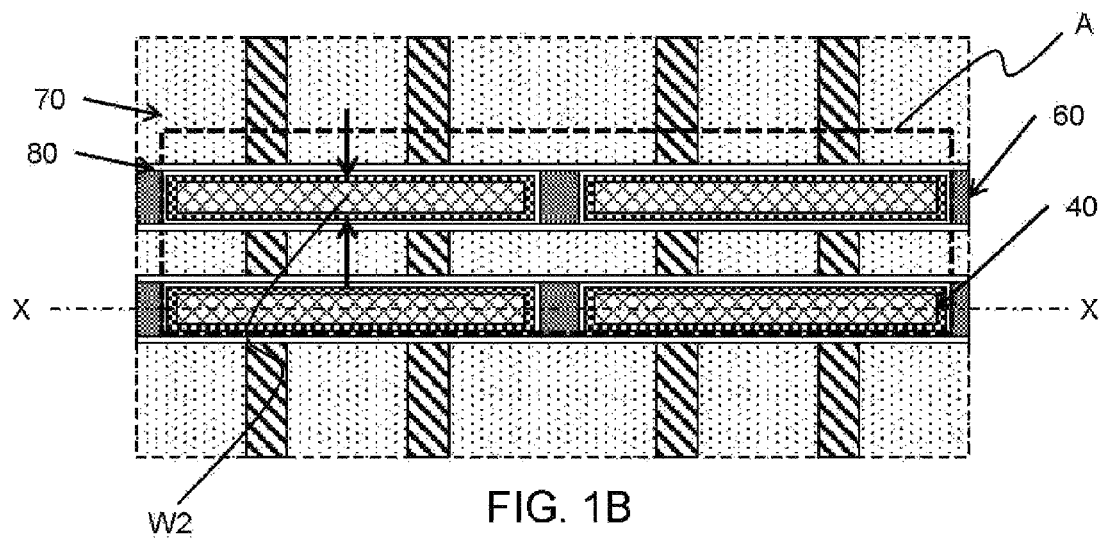
FIG. 1B is an exemplary top view of the semiconductor FET device having a fin structure.
Figure 1C:
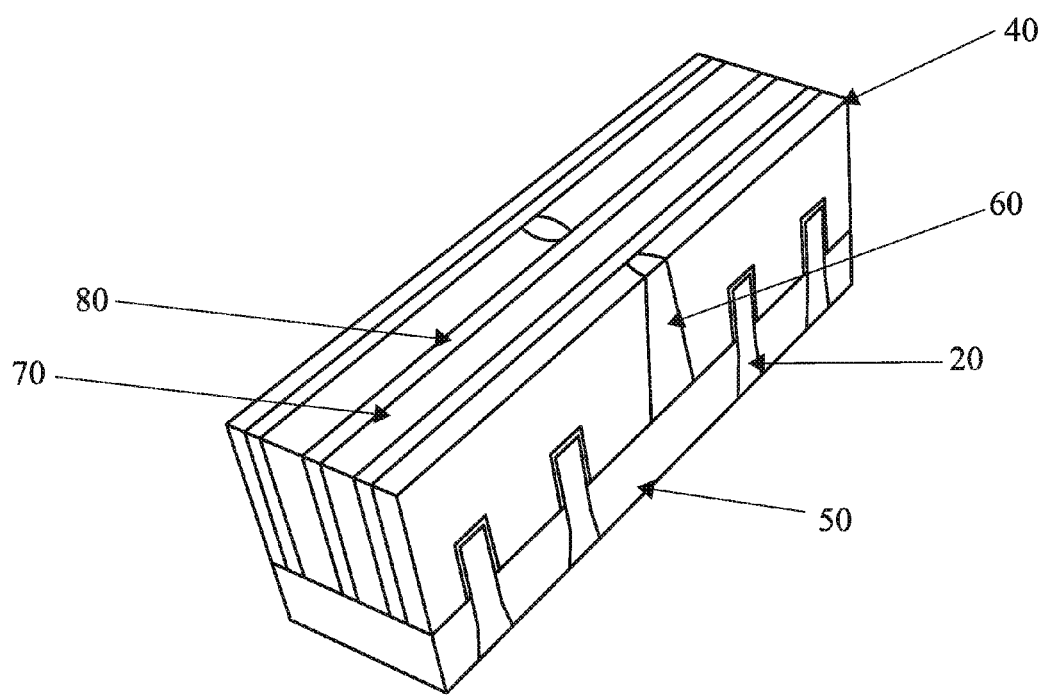
FIG. 1C is an exemplary perspective view of the semiconductor FET device having a fin structure, corresponding to the enclosed portion in FIG. 1B, according to one embodiment of the present disclosure.

FIG. 1A is an exemplary cross sectional view of a semiconductor FET device having a fin structure (Fin FET), FIG. 1B is an exemplary top view of the semiconductor FET device having a fin structure, and FIG. 1C is an exemplary perspective view of the semiconductor FET device having a fin structure according to one embodiment of the present disclosure. FIG. 1A is the cross sectional view along line X-X in FIG. 1B, and FIG. 1C corresponds to the enclosed portion A in FIG. 1B. In these figures, some layers/features are omitted for simplification. FIGS. 1A-1C show the device structure after a metal gate structure has been formed.

The Fin FET device 1 includes a first device region 1A and a second device region 1B. The first device region 1A includes one or more first Fin FET devices, and the second device region includes one or more second Fin FET devices. A channel type of the first Fin FET transistor is the same as or different from a channel type of the second Fin FET transistor.

In one embodiment, the first device region 1A includes p-type MOS FETs and the second device region 1B includes n-type MOS FETs. In other embodiments, the first and second device regions include p-type MOS FETs, the first and second device regions include n-type MOS FETs or the first and second device regions include both p-type and n-type MOS FETs.

The Fin FET device 1 includes, among other features, a substrate 10, fin structures 20, a gate dielectric 30 and a gate electrode 40. In this embodiment, the substrate 10 is a silicon substrate. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structure 20 is disposed over the substrate 10. The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

In FIG. 1A, two fin structures 20 are disposed in the first device region 1A and in the second device region 1B, respectively. However, the number of the fin structures is not limited to two (or four). The numbers may be one, two, three or five or more. In addition, one of more dummy fin structures may be disposed adjacent both sides of the fin structures 20 to improve pattern fidelity in patterning processes. The width W1 of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments.

The lower part of the fin structure 20 under the gate electrode 40 is referred to as a well layer, and the upper part of the fin structure 20 is referred to as a channel layer. Under the gate electrode 40, the well layer is embedded in the isolation insulating layer 50, and the channel layer protrudes from the isolation insulating layer 50. A lower part of the channel layer may also be embedded in the isolation insulating layer 50 to a depth of about 1 nm to about 5 nm.

The height of the well layer is in a range of about 60 nm to 100 nm in some embodiments, and the height of the channel layer is in a range of about 40 nm to 60 nm.

Further, spaces between the fin structures 20 and/or a space between one fin structure and another element formed over the substrate 10 are filled by an isolation insulating layer 50 (or so-called a "shallow-trench-isolation (STI)" layer) including an insulating material, and an interlayer dielectric layer 70 disposed over the isolation insulating layer 50. The insulating material for the isolation insulating layer 50 and the interlayer dielectric layer 70 may include silicon oxide, silicon nitride, silicon oxynitride (SiON), SiOCN, fluoride-doped silicate glass (FSG), or a low-K dielectric material. The insulating material for the isolation insulating layer 50 may be the same as or different from that for the interlayer dielectric layer 70.

The channel layer of the fin structure 20 protruding from the isolation insulating layer 50 is covered by a gate dielectric layer 30, and the gate dielectric layer 30 is further covered by a gate electrode 40. Part of the channel layer not covered by the gate electrode 40 functions as a source and/or drain of the MOS FET (see, FIG. 1B). The fin structures 20 extend in a first direction and the gate electrodes 40 extends in a second direction perpendicular to the first direction.

In certain embodiments, the gate dielectric layer 30 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 40 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In certain embodiment, the gate electrode includes a metal gate layer 45.

In certain embodiments of the present disclosure, one or more work function adjustment layers 42 may also be disposed between the gate dielectric layer 30 and the metal gate layer 45. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer may include a first metal material for the p-channel Fin FET (e.g., in the first device region 1A) and a second metal material for the n-channel Fin FET (e.g., in the second device region 1B). For example, the first metal material for the n-channel Fin FET may include metals having a work function substantially aligned with a work function of the substrate conduction band, or at least substantially aligned with a work function of the conduction band of the channel layer of the fin structure 20. Similarly, for example, the second metal material for the p-channel Fin FET may include metals having a work function substantially aligned with a work function of the substrate valence band, or at least substantially aligned with a work function of the valence band of the channel layer of the fin structure 20. In some embodiments, the work function adjustment layer may alternately include a polysilicon layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions are also formed in the fin structure not covered by the gate electrode 40, by appropriately doping impurities in the source and drain regions. An alloy of Si or Ge and a metal such as Co, Ni, W, Ti or Ta may be formed on the source and drain regions 25. Si and/or SiGe layers may be epitaxially formed in the source-drain regions to form a raised source-drain structure and to apply appropriate stresses to the channel layer.

Further, side-wall insulating layers 80 are disposed at both sides of the gate electrode 40. The gate electrode 40 and the source/drain regions are covered by the interlayer dielectric layer 70, and necessary wirings and/or via/contact holes are disposed so as to complete the semiconductor device.

The width W2 of the gate electrode 40 including the work function adjusting layer 42 and the metal gate layer 45 is in a range of about 20 nm to 40 nm in some embodiments. When plural gate electrodes 40 are arranged in the width direction (see, FIG. 1B), a pitch of the gate electrodes is in a range of about 60 nm to 100 nm in some embodiments.

As shown in FIGS. 1A-1C, adjacent gate electrodes 40 are separated from each other by a separation plug 60 made of an insulating material. In the cross section shown in FIG. 1A, the separation plug 60 has a tapered shape having a smaller top size (width) and a larger bottom size (width). The width W3 at the top of the separation plug is less than about 20 nm in certain embodiments and may be in a range of about 5 nm to about 15 nm in some embodiments. The width W4 at the bottom of the separation plug is less than about 35 nm in certain embodiments and may be in a range of about 10 nm to about 30 nm in some embodiments. Here, the top of the separation plug corresponds to the upper surface of the gate electrode 40 and the bottom of the separation plug 60 corresponds to the bottom of the gate dielectric layer 30 or the interface between the isolation insulating layer 50 and the interlayer dielectric layer 70. The insulating material for the separation plug 60 may include silicon oxide, silicon nitride, silicon oxynitride (SiON), SiOCN, fluoride-doped silicate glass (FSG), or a low-K dielectric material.

The insulating material for the separation plug 60 may be the same as or may be different from an insulating material for the isolation insulating layer 50 and/or the interlayer dielectric layer 70.

FIGS. 2-12E show cross sectional views of exemplary sequential processes of manufacturing the Fin FET device according to one embodiment of the present disclosure. It is understood that additional operations can be provided before, during, and after processes shown by FIGS. 2-12E, and some of the operations described below can be replaced or eliminated, for additional embodiments of the method. The order of the operations/processes may be interchangeable. Further, the general operations for manufacturing a metal gate structure over the fin structure by gate replacement technologies are disclosed in U.S. Patent Publication No. 2013/0161762, the entire contents of which are incorporated herein by reference.

To fabricate a fin structure, a mask layer is formed over the substrate 10 by, for example, a thermal oxidation process and/or a chemical vapor deposition (CVD) process. The substrate 10 is, for example, a p-type silicon substrate with an impurity concentration being in a range of about $1.12 \times 10^{15}$ cm$^{-3}$ and about $1.68 \times 10^{15}$ cm$^{-3}$. In other embodiments, The substrate 10 is an n-type silicon substrate with an impurity concentration being in a range of about $0.905 \times 10^{15}$ cm$^{-3}$ and about $2.34 \times 10^{15}$ cm$^{-3}$. The mask layer includes, for example, a pad oxide (e.g., silicon oxide) layer and a silicon nitride mask layer in some embodiments.

The pad oxide layer may be formed by using thermal oxidation or a CVD process. The silicon nitride mask layer may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a photo resist pattern formed by photo lithography.

By using the mask pattern as an etching mask, a hard mask pattern 100 of the pad oxide layer 106 and the silicon nitride mask layer 107 is formed. The width of the hard mask pattern is in a range of about 5 nm to about 40 nm in some embodiments. In certain embodiments, the width of the hard mask patterns is in a range of about 7 nm to about 12 nm.

Figure 2:
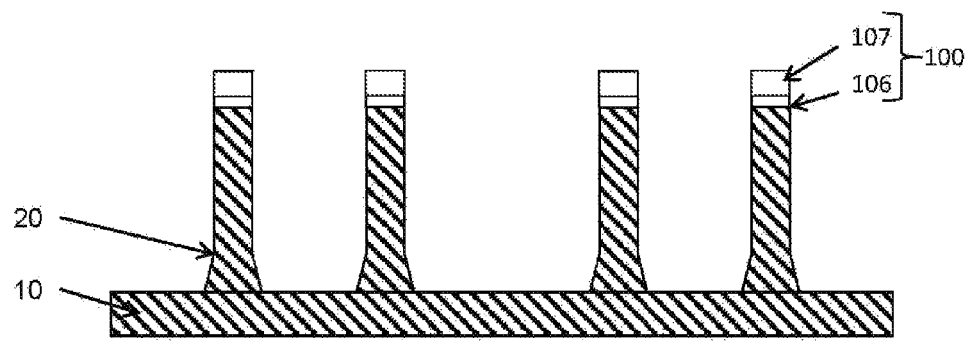
FIGS. 2-12E show exemplary processes for manufacturing the Fin FET device according to one embodiment of the present disclosure.

As shown in FIG. 2, by using the hard mask pattern as an etching mask, the substrate 10 is pattered into fin structures 20 by trench etching using a dry etching method and/or a wet etching method. A height of the fin structure 20 is in a range of about 100 nm to about 300 nm. In certain embodiments, the height is in a range of about 50 nm to about 100 nm. When the heights of the fin structures are not uniform, the height from the substrate may be measured from the plane that corresponds to the average heights of the fin structures.

In this embodiment, a bulk silicon wafer is used as a starting material and constitutes the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

Figure 3:
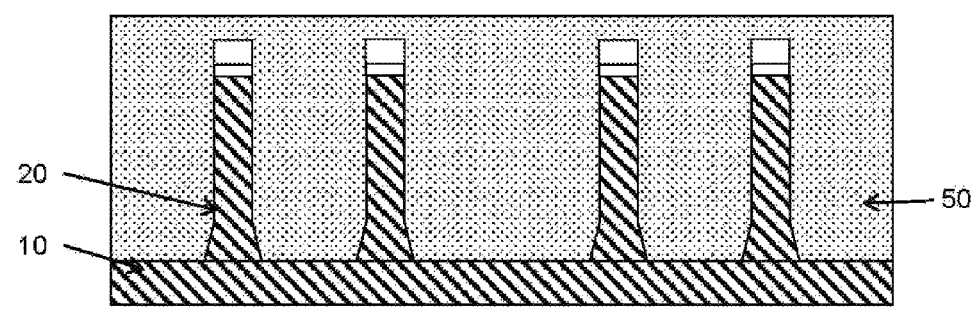

As shown in FIG. 3, an isolation insulating layer 50 is formed over the substrate 10 so as to fully cover the fin structure 20.

The isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total. The isolation insulating layer 50 may be formed by using SOG. SiO, SiON, SiOCN or fluoride-doped silicate glass (FSG) may be used as the isolation insulating layer 50 in some embodiments.

Figure 4:
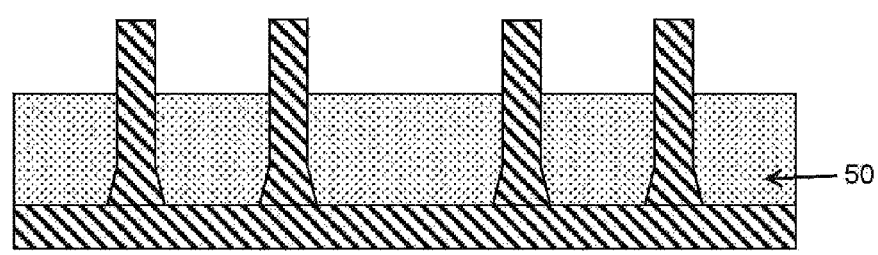

After forming the isolation insulating layer 50, a planarization operation is performed so as to remove part of the isolation insulating layer 50 and the mask layer 100 including the pad oxide layer 106 and the silicon nitride mask layer 107. Then, the isolation insulating layer 50 is further removed so that an upper part of the fin structure 20, which is to become a channel layer, is exposed, as shown in FIG. 4.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in inert gas ambient, for example, N$_2$, Ar or He ambient.

A gate oxide layer 105 and a poly silicon layer are formed over the isolation insulating layer 50 and the exposed fin structures 20, and then patterning operations are performed so as to obtain a poly gate layer 110 made of poly silicon. The gate oxide layer 105 may be silicon oxide formed by CVD, PVD, ALD, e-beam evaporation, or other suitable process. A thickness of the poly silicon layer is in a range of about 5 to about 100 nm in some embodiments.

Side-wall insulating layers 80 are also formed at both sides of the poly gate layer 110.

Figure 5A:
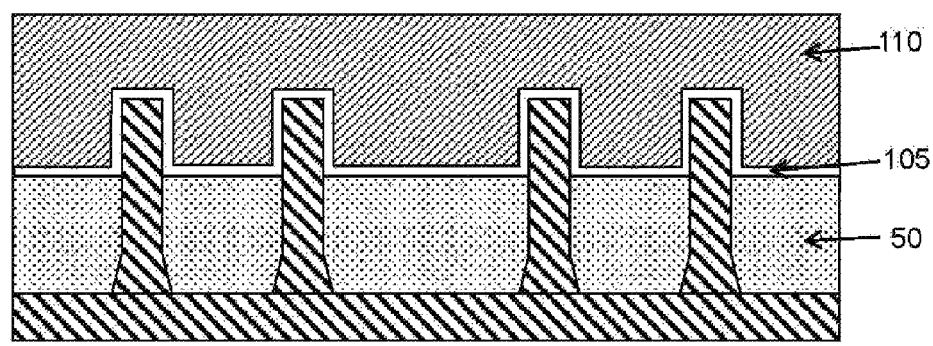
Figure 5B:
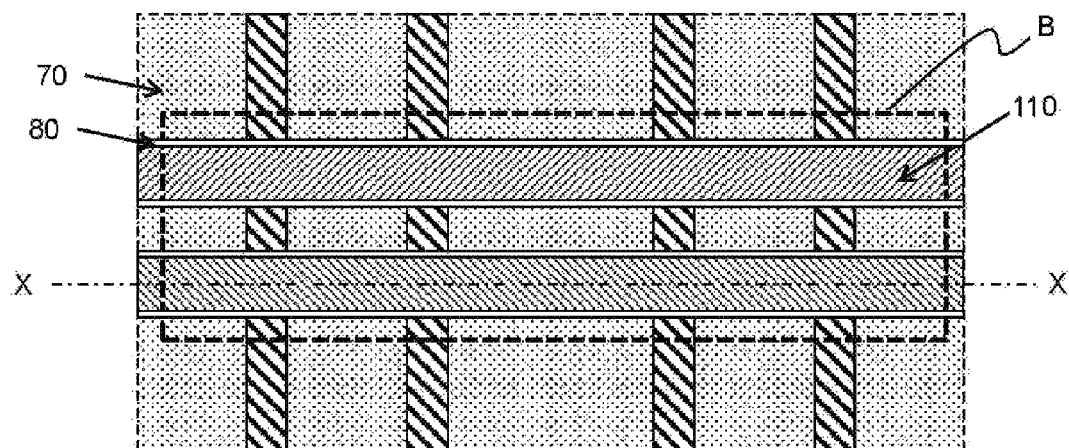
Figure 5C:
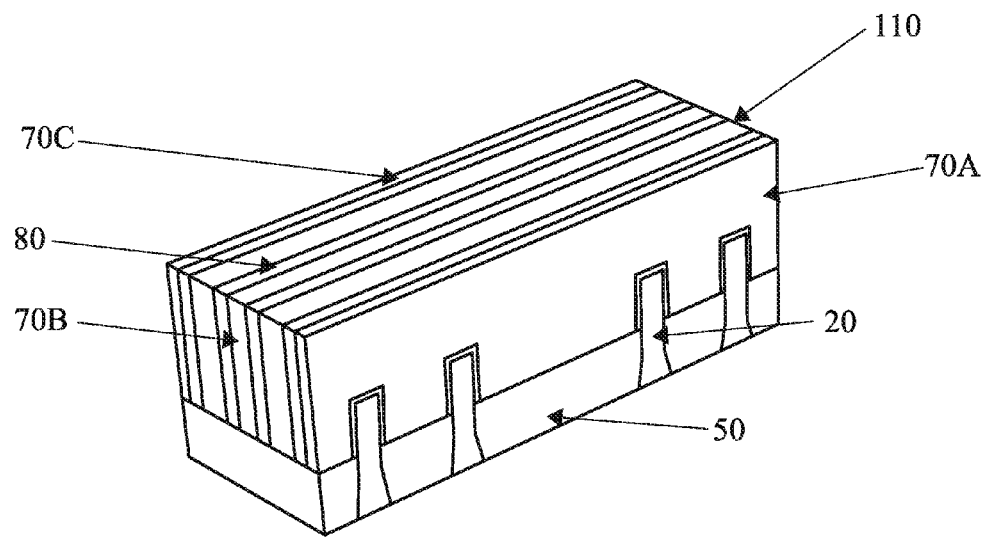

Further, an interlayer dielectric layer 70 is formed in spaces between the poly gate layers 110, the side-wall insulating layers 80 and over the poly gate layer 110. Planarization operations, such as an etch back process and/or a chemical mechanical polishing (CMP) process, are performed, so as to obtain the structure shown in FIGS. 5A-5C. FIG. 5A is the cross sectional view, FIG. 5B is the top view, and FIG. 5C is a perspective view of the Fin FET device after the poly gate layer 110 and the interlayer dielectric layer 70 are formed. FIG. 5A is the cross sectional view along line X-X in FIG. 5B, and FIG. 5C corresponds to the enclosed portion B in FIG. 5B.

As shown in FIGS. 5B and 5C, in certain embodiments, the poly gate layers 110 are formed in a line-and-space arrangement extending in one direction with a constant pitch. The poly gate layer 110 may include another line-and-space arrangement extending in another direction perpendicular to the one direction.

Figure 6:
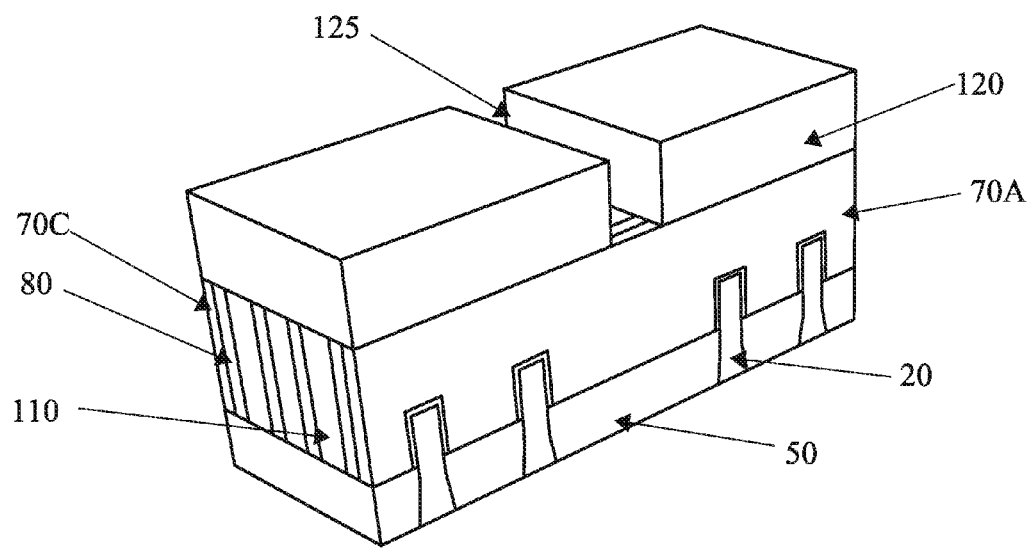

As shown in FIG. 6, a mask pattern 120 is formed over the structure shown in FIG. 5C. The mask pattern 120 is formed by, for example, a photo resist layer having a slit 125. A width of the slit 125 is in a range of about 5 nm to about 100 nm, in some embodiments.

Figure 7:
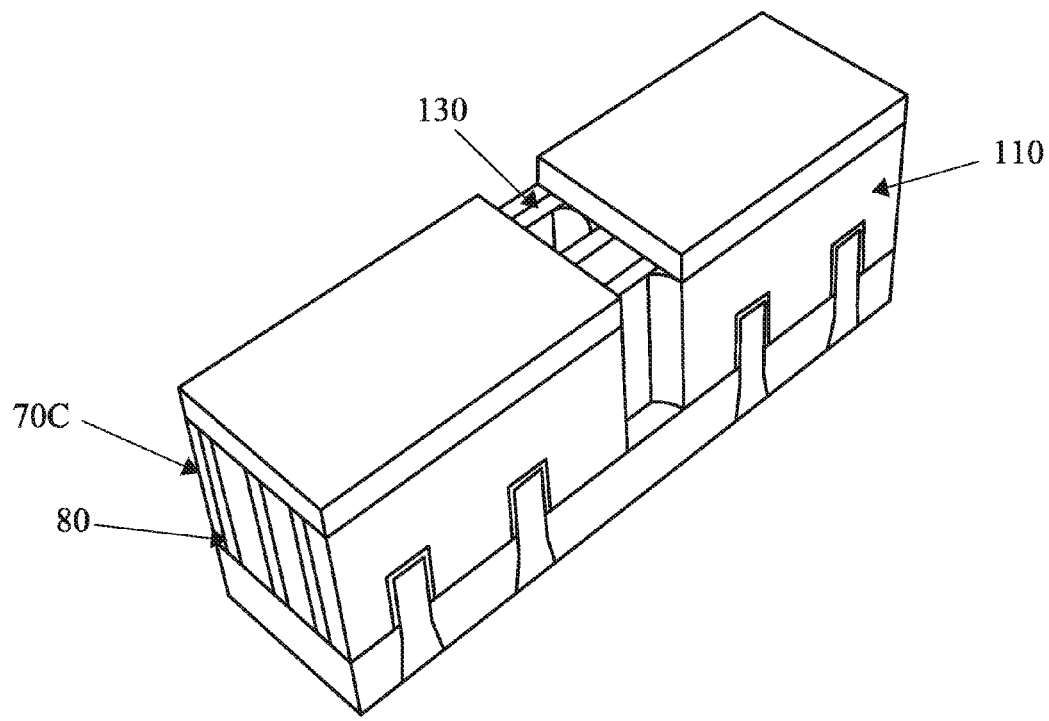

As shown in FIG. 7, by using the mask pattern 120, a part of poly gate layer is etched. In FIG. 7 and thereafter, one layer 70A of the interlayer dielectric layers 70 is omitted to illustrate the etched poly gate layer 110, while other layer 70B and 70C are still shown. The etching of the poly gate layer is performed by plasma etching using gases including $CH_4$, $CF_4$, $CH_2F_2$, $CHF_3$, $O_2$, HBr, $Cl_2$, $NF_3$, $N_2$ and/or He under the pressure of 3 to 20 mTorr, in some embodiments.

The mask pattern 120 (photo resist pattern) is removed by an ashing process and/or a wet cleaning process.

Figure 8:
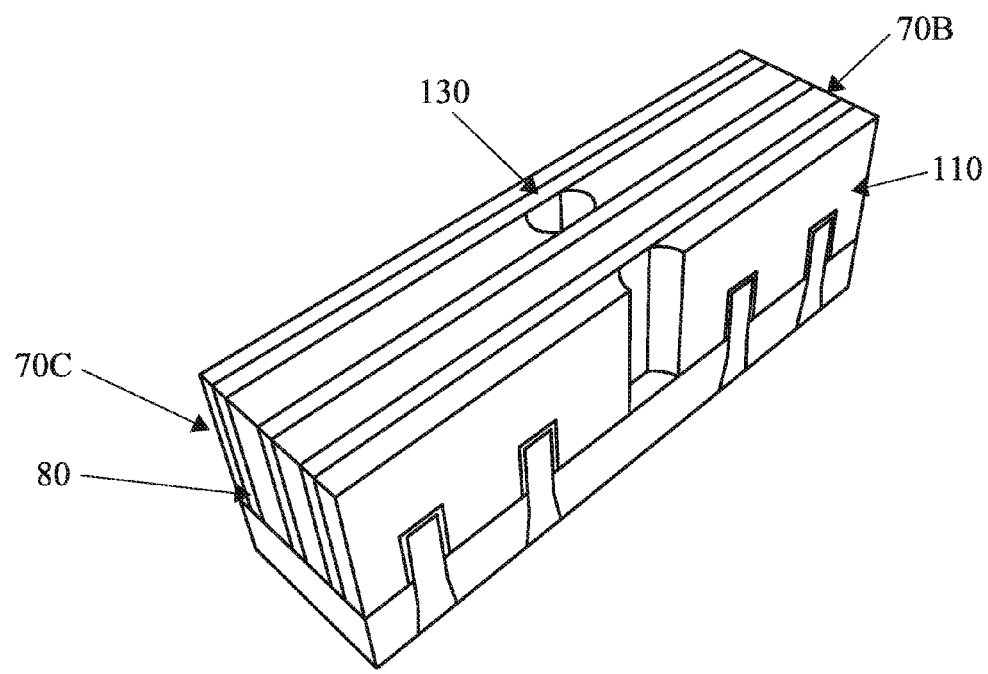

FIG. 8 shows the resultant structure after openings 130 that separate the poly gate layers 110 are formed. In FIG. 8, the top shape of the opening 130 is circular. However, the shape may be rectangular, rectangular with rounded corners or ellipsoid, depending on dimensions of the structure, patterning conditions of the mask pattern 120 and/or etching conditions for the poly gate layer 110.

It is also noted that the cross sectional view of the opening 130 has a tapered shape having a larger top size and a smaller bottom size.

An insulating material is formed over the structure shown in FIG. 8, by using, for example, a CVD process, and the opening 130 is filled with the insulating material. The CVD process may include a LPCVD process, a plasma CVD process and/or a Flowable CVD process. In the Flowable CVD process, gases including $SiH_4$, $NH_3$, $N_2$, $O_2$, $N_2O$, $Cl_2$ and/or $NO_2$ may be used and the deposition is performed at a temperature in a range about 200° C. to about 1000° C., in some embodiments.

Figure 9:
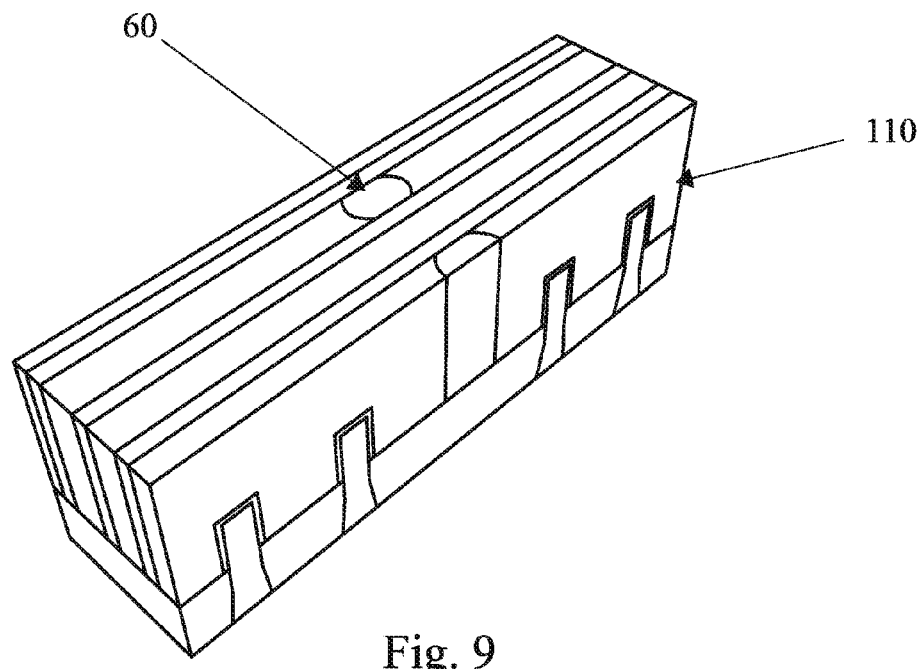

After the unnecessary portion of the insulating material formed over the poly gate layers, side-wall insulating layers and interlayer dielectric layers, is removed by planarization operations, separation plugs 60 are obtained, as shown in FIG. 9. The planarization operations may include a CMP and/or an etch-back process.

Figure 10:
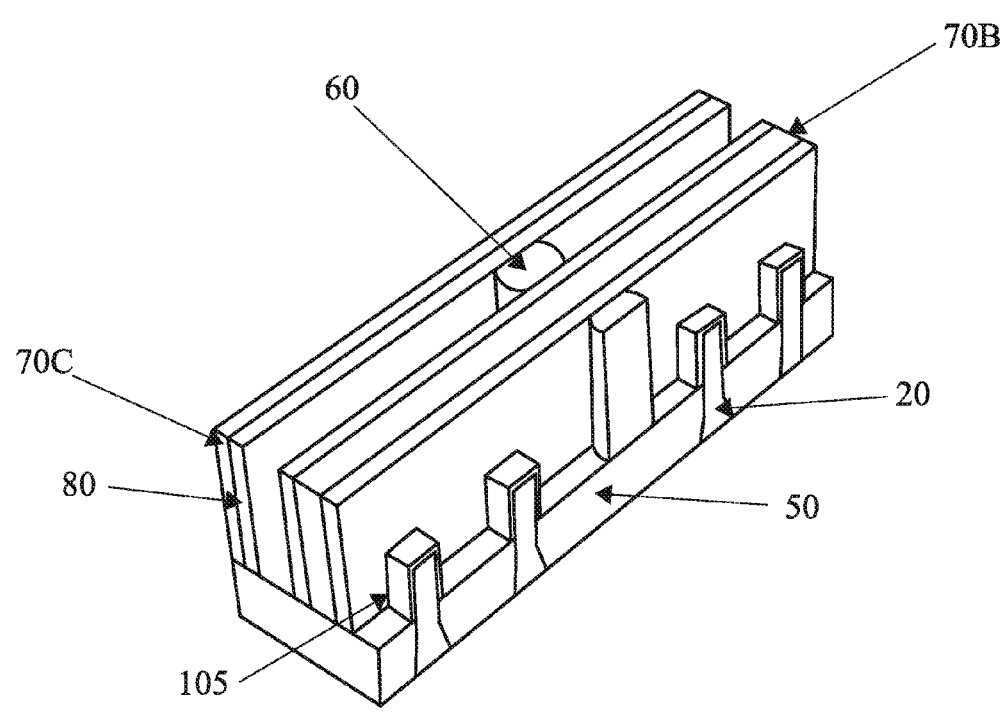

After forming the separation plugs 60, the poly gate layers 110 are removed by dry etching and/or wet etching. By removing the poly gate layers 110, the separation plugs 60 are exposed, as shown in FIG. 10. Since the upper portions of the fin structures 20 are covered by the gate oxide 105, the fin structures 20 are not etched in the poly gate etching process.

Here, since the cross sectional view of the opening 130 has a tapered shape having a larger top size and a smaller bottom size, the separation plug 60 as exposed has a reverse-tapered shape having a larger top size and a smaller bottom size.

Figure 11:
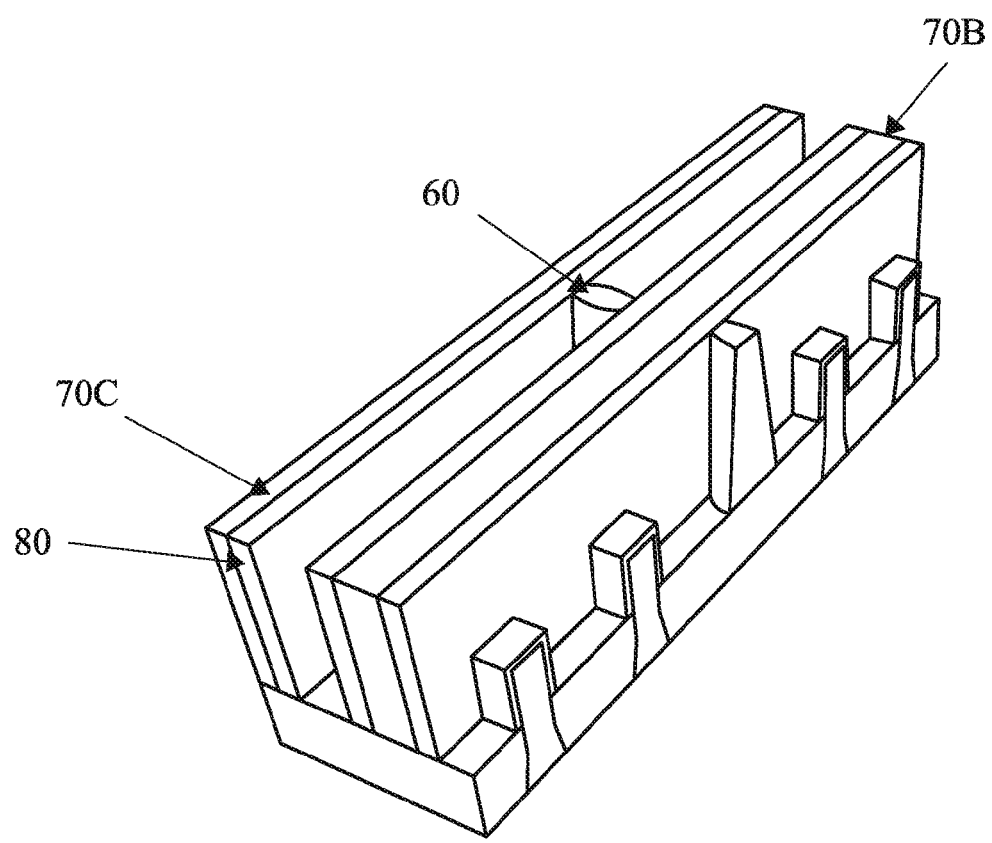

As shown in FIG. 11, an additional etching process is performed to the exposed separation plugs 60 to make the cross section of the separation plugs have a tapered shape having a smaller top size and a larger bottom size. The additional etching of the separation plugs is performed by plasma etching using gases including $CH_4$, $CF_4$, $CH_2F_2$, $CHF_3$, $O_2$, HBr, $Cl_2$, $NF_3$, $N_2$ and/or He under the pressure of 3 to 20 mTorr, in some embodiments. The plasma etching of the separation plugs may include anisotropic etching followed by isotropic etching.

FIGS. 12A-12E show details and variations of the additional etching operations. After the poly gate layers 110 are removed, reverse-tapered separation plugs 60 are exposed. A taper angle $\theta$ at the bottom of the separation plug 60 is an acute angle (less than 90 degrees) in a range of about 80 to about 87 degrees.

Figure 12A:
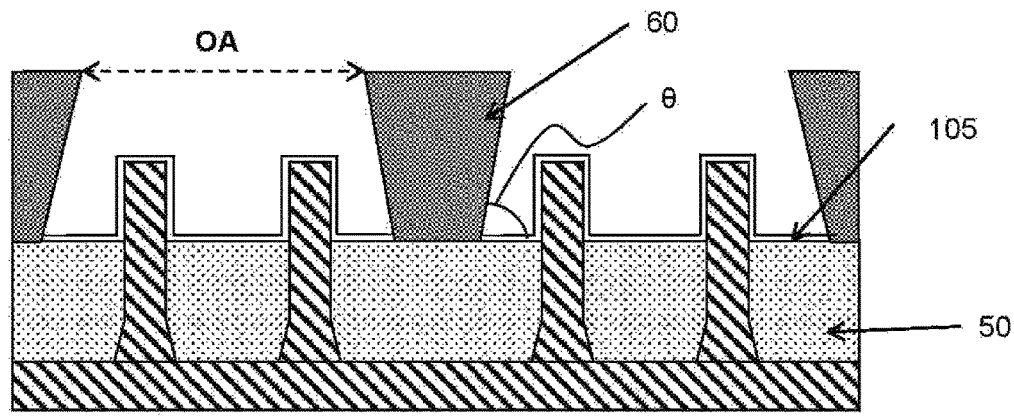
Figure 12B:
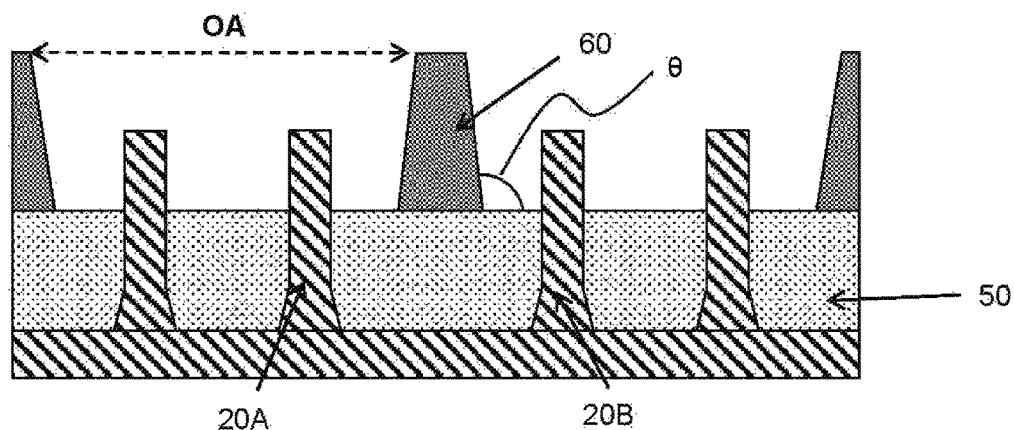

By performing the additional etching operations, the width of the upper portion of the separation plug is reduced, and the tapered shape separation plug 60 is obtained, as shown in FIG. 12B. The taper angle $\theta$ at the bottom of the separation plug 60 is 90 degrees or more. In some embodiments, the taper angle $\theta$ is in a range of about 93 to about 100 degrees.

Figures 12C, 12D, 12E:
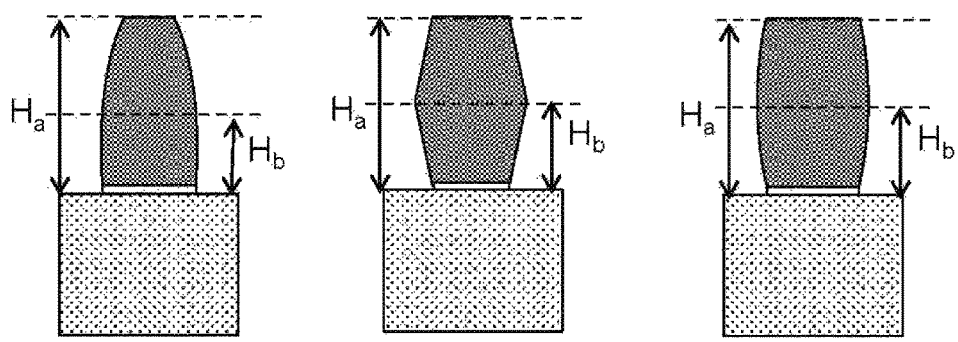

Depending on conditions of the additional etching operations, the shape of the separation plug 60 in the cross section may have a rounded shape, a hexagonal shape or a barrel shape, as shown in FIGS. 12C-12D, in some embodiments. In FIGS. 12C-12D, the maximum width in the cross section is located at the height $H_b$, which is less than ¾ of the height $H_a$ of the separation plug. In some embodiments, $H_b$ is less than ½ of $H_a$.

In these variations of the shapes of the separation plug 60, since the width of the top portion of the exposed separation plug is reduced, opening area OA becomes wider. This wider opening OA makes it possible for metal materials for the metal gate structure to more conformally fill the space formed by removing the poly gate layers 110.

After the operations in FIG. 11, a metal gate structure is formed in the space between the separation plug, which is created by removing the poly gate layers 110, thereby obtaining the structure shown in FIGS. 1A-1C.

FIGS. 13-18 show cross sectional views of exemplary sequential processes of manufacturing the Fin FET device according to another embodiment of the present disclosure. It is understood that additional operations can be provided before, during, and after processes shown by FIGS. 13-18, and some of the operations described below can be replaced or eliminated, for additional embodiments of the method. The order of the operations/processes may be interchangeable.

Figure 13:
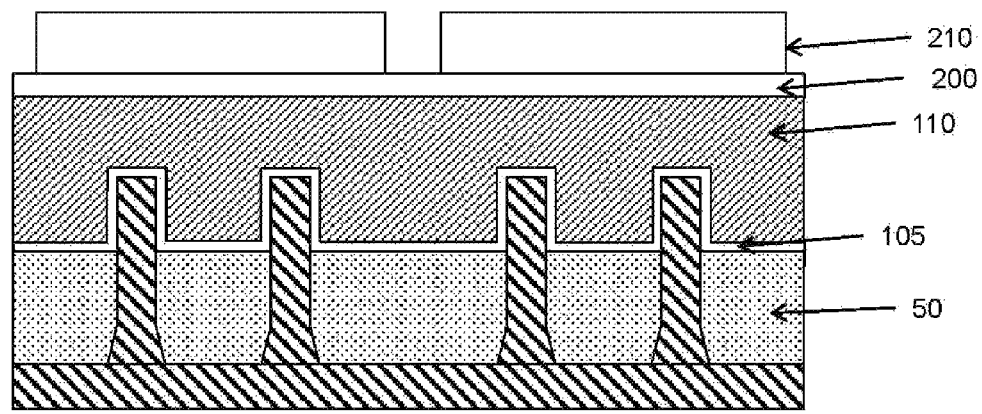
FIGS. 13-18 show cross sectional views of exemplary sequential processes of manufacturing the Fin FET device according to another embodiment of the present disclosure.

After forming the structure shown in FIG. 5A-5C, a mask layer 200 is formed over the poly gate layers 110, the side-wall insulating layers 80 the interlayer insulating layers 70. The mask layer is a material having a high etching selectivity against poly silicon. In certain example, the mask layer 200 is silicon oxide having a thickness in a range about 100 nm to about 300 nm. On the mask layer 200, a resist pattern 210 is formed having openings, as shown in FIG. 13.

Figure 14:
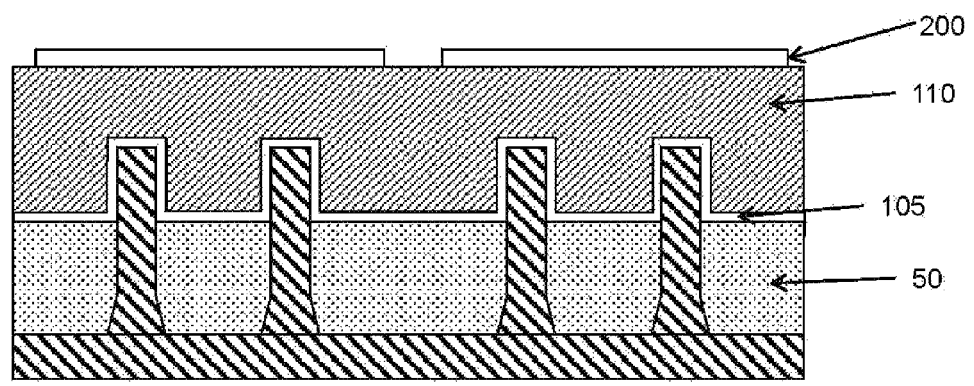

By using the resist pattern 210 as a mask, the mask layer 200 is patterned, as shown in FIG. 14.

Figure 15:
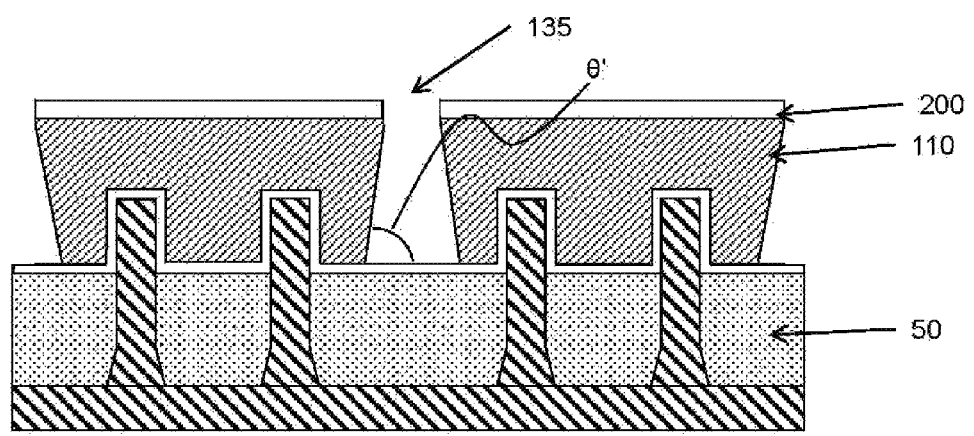

A shown in FIG. 15, by using the pattered mask layer 200 as an etching mask, the poly gate layer 100 is patterned so that the opening 135 has a reverse tapered shape. A taper angle θ' at the bottom of the opening 135 measured in the opening is 90 degrees or less, and may be in a range of about 80 to about 87 degrees in some embodiments.

To form the opening 135, plasma etching may be used. In some embodiment, fluorocarbon gas, chlorocarbon gas, chlorofluorocarbon gas or a mixture thereof are used as etching gas, under a pressure of about 10 Pa to about 100 Pa.

Figure 16:
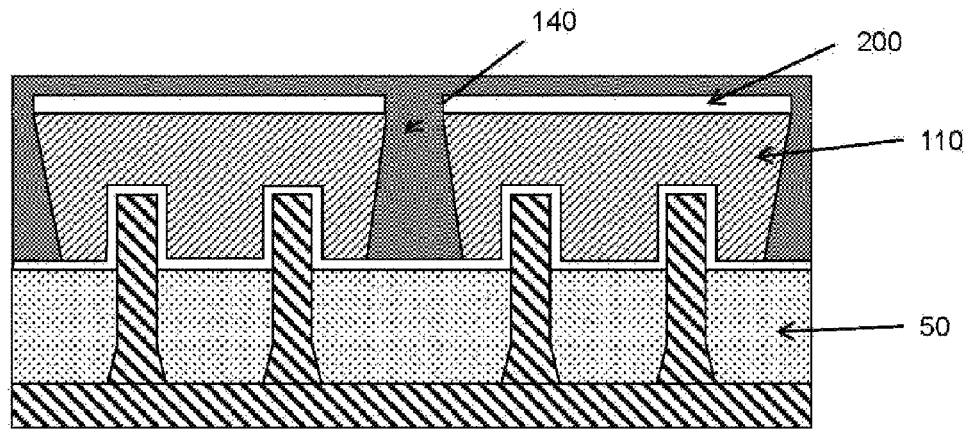

As shown in FIG. 16, an insulating material is formed over the structure shown in FIG. 15, by using, for example, a CVD process, and the opening 135 is filled with the insulating material.

Figure 17:
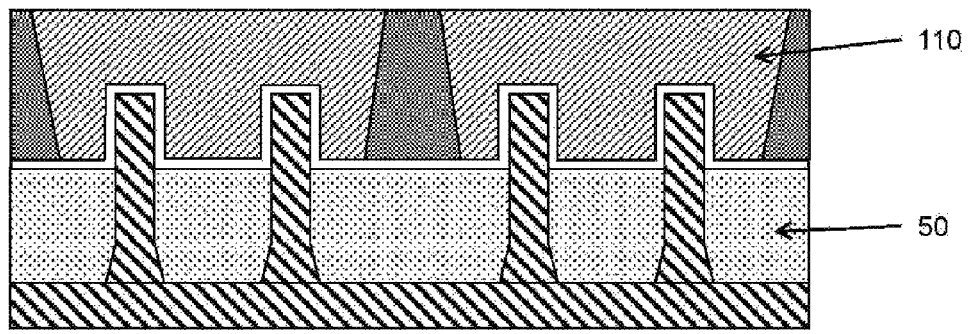

As shown in FIG. 17, a portion of the insulating material and mask layer 200 are removed by planarization operations including a CMP and/or an etch back process, thereby obtaining separation plugs 60 having a tapered shape.

After forming the separation plugs 60, the poly gate layer 110 is removed by dry etching and/or wet etching. By removing the poly gate layer 110, the separation plugs 60 are exposed, as shown in FIG. 18.

Figure 18:
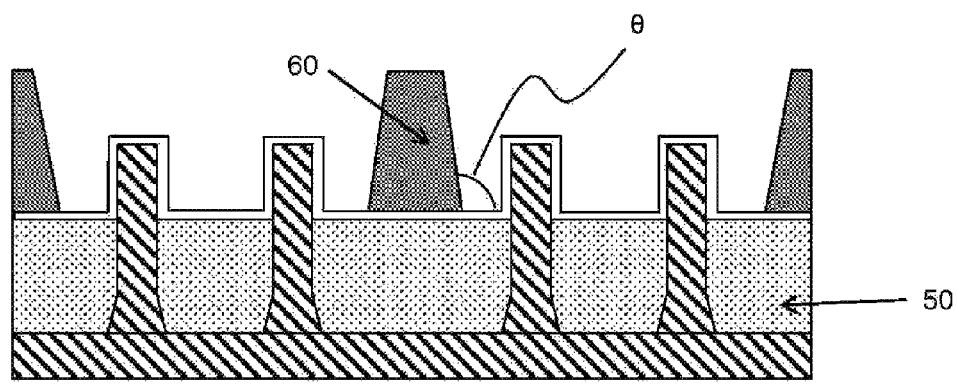

In FIG. 18, the taper angle θ at the bottom of the separation plug 60 is 90 degrees or more. In some embodiments, the taper angle θ is in a range of about 93 to about 100 degrees.

After the operations in FIG. 18, a metal gate structure is formed in the space between the separation plug, which is created by removing the poly gate layers 110, thereby obtaining the structure shown in FIGS. 1A-1C.

The various embodiments or examples described herein offer several advantages over the existing art. For example, since the width of the top portion of the separation plug is reduced to have the top width than the bottom width, opening area after removing the poly gate layers becomes wider, and in particular, the top width becomes wider. This wider opening makes it possible for metal materials for the metal gate structure to more conformally fill the space formed by removing the poly gate layers.

Further, since the separation plug is etched, the width of the entire separation plug becomes smaller. Accordingly, the distance between two adjacent fin structures (fin structures 20A and 20B shown in FIG. 1) becomes smaller.

It will be understood that not all advantages have been necessarily discussed herein, no particular advantage is required for all embodiments or examples, and other embodiments or examples may offer different advantages. In accordance with one aspect of the present disclosure, a semiconductor device includes a first Fin FET transistor, a second Fin FET transistor and a separation plug disposed between the first Fin FET transistor and the second FinFET transistor. The first Fin FET transistor includes a first fin structure extending in a first direction, a first gate dielectric formed over the first fin structure and a first gate electrode formed over the first gate dielectric and extending a second direction perpendicular to the first direction. The second Fin FET transistor includes a second fin structure, a second gate dielectric formed over the second fin structure and a second gate electrode formed over the first gate dielectric and extending the second direction. The separation plug is made of an insulating material. In a cross section along the second direction and across the first gate electrode, the second gate electrode and the separation plug, a maximum width of the separation plug is located at a height $H_b$, which is less than ¾ of a height $H_a$ of the separation plug.

In accordance with another aspect of the present disclosure, a method for manufacturing a semiconductor device includes forming a dummy electrode structure including a dummy electrode layer and interlayer dielectric layers disposed at both sides of the dummy electrode layer. The dummy electrode layer is patterned so that the dummy electrode layer is divided into at least a first dummy electrode and a second dummy electrode separated by an opening. A separation plug is formed by filling the opening with an insulating material. The first and second dummy electrodes are removed so that a first electrode space and a second electrode space are formed and the separation plug is exposed between the first electrode space and the second electrode space. The exposed separation plug is etched so that in a cross section across the first electrode space, the second electrode space and the separation plug, a maximum width of the separation plug is located at a height $H_b$, which is less than ¾ of a height $H_a$ of the separation plug. A first gate structure and a second gate structure are formed in the first electrode space and the second electrode space, respectively.

In accordance with another aspect of the present disclosure, a method for manufacturing a semiconductor device includes forming a dummy electrode structure including a dummy electrode layer and interlayer dielectric layers disposed at both sides of the dummy electrode layer. The dummy electrode layer is patterned so that the dummy electrode layer is divided into at least a first dummy electrode and a second dummy electrode separated by an opening. A separation plug is formed by filling the opening with an insulating material. The first and second dummy electrodes are removed so that a first electrode space and a second electrode space are formed and the separation plug is exposed between the first electrode space and the second electrode space. A first gate structure and a second gate structure are formed in the first electrode space and the second electrode space, respectively. A shape of the opening before forming the separation plug has a tapered shape having a top size (width) of the opening smaller than a bottom size (width) of the opening.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first fin structure extending in a first direction;
   a first gate structure including a first gate dielectric layer formed over the first fin structure and a first gate electrode formed over the first gate dielectric layer, the first gate structure extending in a second direction perpendicular to the first direction;
   a second fin structure extending in the first direction;
   a second gate structure including a second gate dielectric layer formed over the second fin structure and a second gate electrode formed over the first gate dielectric layer, the second gate structure extending in the second direction; and a separation plug made of an insulating material and disposed between the first gate structure and the second gate structure, wherein in a cross section along the second direction and across the first gate electrode, the second gate electrode and the separation plug, a maximum width of the separation plug is located at a height $H_b$, which is less than ¾ of a height $H_a$ of the separation plug.

2. The semiconductor device of claim 1, wherein in the cross section, the separation plug has a tapered shape having a top width smaller than a bottom width.

3. The semiconductor device of claim 2, wherein a taper angle of the separation plug at a bottom of the separation plug is 90 degrees or more.

4. The semiconductor device of claim 1, wherein:
the first gate electrode includes one or more layers of first work function adjusting metals and a first metal gate material, and
the second gate electrode includes one or more layers of second work function adjusting metals and a second metal gate material.

5. The semiconductor device of claim 1, wherein the first fin structure under the first gate structure and the second fin structure under the second gate structure have a same conductivity type.

6. The semiconductor device of claim 1, wherein the first fin structure under the first gate structure has a different conductivity type than the second fin structure under the second gate structure.

7. The semiconductor device of claim 1, wherein two or more first fin structures are included in the first FinFET.

8. A semiconductor device, comprising:
a first fin field effect transistor (FinFET) including a first fin structure extending in a first direction, a first gate dielectric formed over the first fin structure and a first gate electrode formed over the first gate dielectric and extending in a second direction perpendicular to the first direction;
a second FinFET including a second fin structure, a second gate dielectric formed over the second fin structure and a second gate electrode formed over the first gate dielectric and extending in the second direction; and
a separation plug made of an insulating material and disposed between the first FinFET and the second FinFET,
wherein in a cross section along the second direction and across the first gate electrode, the second gate electrode and the separation plug, a top width of the separation plug is smaller than a bottom width of the separation plug.

9. The semiconductor device of claim 8, further comprising sidewall insulating layers disposed on opposing sidewalls of the first and second gate electrodes and the separation plug.

10. The semiconductor device of claim 9, further comprising dielectric layers disposed on the sidewall insulating layers and over the first and second fin structures not covered by the first and second gate electrodes, respectively.

11. The semiconductor device of claim 10, wherein the separation plug is a made of a material different from a material of the dielectric layer.

12. The semiconductor device of claim 8, further comprising an isolating insulating layer from which the first and second fin structures protrude,
wherein the separation plug is a made of a material different from a material of the isolation insulating layer.

13. The semiconductor device of claim 8, wherein a taper angle of the separation plug at a bottom of the separation plug is between 93 degrees and 100 degrees.

14. The semiconductor device of claim 8, wherein:
the first fin structure extends in a first direction and the first gate electrode extends along a second direction crossing the first direction, and
a width of the first gate electrode along the first direction is equal to a width of the separation plug along the first direction, in plan view.

15. A semiconductor device, comprising:
a first fin field effect transistor (FinFET) including first fin structures extending in a first direction, a first gate structure formed over the first fin structures and extending in a second direction perpendicular to the first direction;
a second FinFET including second fin structures, a second gate structure formed over the second fin structures and extending in the second direction;
a third FinFET including the first fin structures, a third gate structure formed over the first fin structures and extending in the second direction and arranged in parallel with the first FinFET in the first direction;
a fourth FinFET including the second fin structures, a fourth gate structure formed over the second fin structures and extending in the second direction and arranged in parallel with the second FinFET in the first direction;
a first separation plug made of an insulating material and disposed between the first FinFET and the second FinFET; and
a second separation plug made of an insulating material and disposed between the third FinFET and the fourth FinFET,
wherein in a cross section along the second direction and across the first gate electrode, the second gate electrode and the first separation plug, a top width of the first separation plug is smaller than a bottom width of the first separation plug.

16. The semiconductor device of claim 15, wherein in a cross section along the second direction and across the third gate electrode, the fourth gate electrode and the second separation plug, a top width of the second separation plug is smaller than a bottom width of the second separation plug.

17. The semiconductor device of claim 16, wherein:
a taper angle of the first separation plug at a bottom of the first separation plug is 90 degrees or more, and
a taper angle of the second separation plug at a bottom of the second separation plug is 90 degrees or more.

18. The semiconductor device of claim 15, wherein:
the first gate electrode includes one or more layers of first work function adjusting metals and a first metal gate material,
the second gate electrode includes one or more layers of second work function adjusting metals and a second metal gate material,
the third gate electrode includes one or more layers of third work function adjusting metals and a first metal gate material, and
the fourth gate electrode includes one or more layers of fourth work function adjusting metals and a second metal gate material.

19. The semiconductor device of claim 15, wherein two or more first fin structures are included in the first FinFET and the third FinFET.

20. The semiconductor device of claim 15, wherein two or more second fin structures are included in the second FinFET and the fourth FinFET.

* * * * *